(12) United States Patent
Chou et al.

(10) Patent No.: US 8,168,374 B2
(45) Date of Patent: May 1, 2012

(54) METHOD OF FORMING A CONTACT HOLE

(75) Inventors: Pei-Yu Chou, Tainan County (TW);
Jiunn-Hsiung Liao, Tainan Hsien (TW)

(73) Assignee: United Microelectronics Corp.,
Science-Based Industrial Park, Hsin-Chu
(TW)

( * ) Notice: Subject to any disclaimer, the term of this patent is extended or adjusted under 35 U.S.C. 154(b) by 77 days.

(21) Appl. No.: 12/854,913

(22) Filed: Aug. 12, 2010

(65) Prior Publication Data

US 2010/0304569 A1    Dec. 2, 2010

Related U.S. Application Data

(62) Division of application No. 11/696,194, filed on Apr. 4, 2007, now Pat. No. 7,799,511.

(51) Int. Cl.
*G03F 7/26* (2006.01)

(52) U.S. Cl. ......... 430/316; 430/311; 430/314; 430/394

(58) Field of Classification Search ................... 430/314, 430/316, 394
See application file for complete search history.

(56) References Cited

U.S. PATENT DOCUMENTS

| | | |
|---|---|---|
| 5,262,500 A | 11/1993 | Chiang |
| 6,303,272 B1 * | 10/2001 | Furukawa et al. ............ 430/314 |
| 6,497,993 B1 | 12/2002 | Chiu |
| 2003/0119330 A1 | 6/2003 | Tsai |
| 2005/0067710 A1 | 3/2005 | Lytle |

* cited by examiner

*Primary Examiner* — Kathleen Duda
(74) *Attorney, Agent, or Firm* — Winston Hsu; Scott Margo

(57) ABSTRACT

A method of forming a contact hole is provided. A pattern is formed in a photo resist layer. The pattern is exchanged into a silicon photo resist layer to form a first opening. Another pattern is formed in another photo resist layer. The pattern is exchanged into a silicon photo resist layer to form a second opening. The pattern having the first, and second openings is exchanged into the interlayer dielectric layer, and etching stop layer to form the contact hole. The present invention has twice exposure processes and twice etching processes to form the contact hole having small distance.

9 Claims, 23 Drawing Sheets

METHOD OF FORMING A CONTACT HOLE

CROSS REFERENCE TO RELATED APPLICATIONS

This application is a divisional application of and claims the benefit of U.S. patent application Ser. No. 11/696,194, filed Apr. 4, 2007.

BACKGROUND OF THE INVENTION

1. Field of the Invention

The present invention relates to a method for forming contact holes. More particularly, the present invention relates to a method for forming contact holes by utilizing two or more exposures and two or more etchings.

2. Description of the Prior Art

With the advancing technology of the semiconductor industry, integrated circuits are being developed to increase the current computing and storage capability. As predicted by Moore's law, the number of transistors doubles every 18 months. The process of semiconductor evolves from 0.18 μm of 1999, 0.13 μm of 2001, 90 nm (0.09 μm) of 2003 to 65 nm (0.065 μm) of 2005 and is approaching 45 nm. Therefore, the density of semiconductor elements on a wafer is increasing with the technology advancement of the semiconductor industry and miniaturization of microelectronic elements and makes the intervals between elements shorter and shorter, which increases the difficulty of the etching process for contact holes.

In prior art methods for producing contact holes, the photo resist layer serves as an etching mask for etching the underlying dielectric layer. For the 45 nm process, the pitch (the distance of centers of two neighboring contact holes) for contact holes must be lower than 155 nm and the "after development inspect critical dimension" (ADICD) must be around 70-80 nm. For the current lithographic tools, it is impossible to create contact holes with pitch lower than 155 nm in one exposure. The current solution is that the desired contact holes are patterned by two exposures with two photo masks on a photo resist layer, and then followed by one etching step.

However, the problem is that when the pitch of contact holes is lower than 140 nm, the above-mentioned two-exposures-then-one-etching method fails because it is beyond the limitation of the current lithographic tools during the second exposure, and consequently contact holes lower than 140 nm pitch cannot be produced.

Accordingly, it is an important issue to achieve contact holes of pitch lower than 140 nm in this regard.

SUMMARY OF THE INVENTION

The present invention therefore provides a method for forming contact holes to solve the above-mentioned problems.

One preferred embodiment of the present invention provides a method for forming a contact hole, comprising providing a substrate to form an etching stop layer, an interlayer dielectric layer and a first silicon-containing photo resist layer thereon sequentially; forming a first photo resist pattern on the first silicon-containing photo resist layer; then performing a first etching procedure on the silicon-containing photo resist layer to form a plurality of first openings by using the first photo resist pattern as an etching mask; removing the first photo resist pattern; forming a second photo resist pattern on the silicon-containing photo resist layer; performing a second etching procedure on the silicon-containing photo resist layer to form a plurality of second openings by using the second photo resist pattern as an etching mask; and performing an etching procedure to form the contact holes in the interlayer dielectric layer and the etching stop layer by using the silicon-containing photo resist layer with the first and second openings as an etching mask.

Another preferred embodiment of the present invention provides a method for forming a contact hole, comprising providing a substrate to form an interlayer dielectric layer and a first silicon-containing photo resist layer thereon sequentially; forming a first photo resist pattern on the first silicon-containing photo resist layer; performing a first etching procedure on the first silicon-containing photo resist layer to form a plurality of first openings by using the first photo resist pattern as an etching mask; removing the first photo resist pattern; then performing an etching procedure to form a plurality of first contact holes in the interlayer dielectric layer by using the first openings as an etching mask; removing the first silicon-containing photo resist layer; forming a second silicon-containing photo resist layer on the interlayer dielectric layer; forming a second photo resist pattern on the second silicon-containing photo resist layer; and performing an etching procedure to form a plurality of second contact holes in the interlayer dielectric layer by using the second photo resist pattern as an etching mask.

The prior art uses the technique of two exposures on the same photo resist layer, but it is futile because it is beyond the limitation of the current lithographic tools. Compared with the prior art technique, the present invention utilizes a different strategy. First, an etching step is performed after a first exposure to transfer the pattern defined by the first exposure onto a silicon-containing photo resist layer or an interlayer dielectric layer. Later, a newly defined pattern is transferred to the silicon-containing photo resist layer or the interlayer dielectric layer by another exposure at different locations on a newly formed photo resist layer. Such two-exposures-and-two-etchings method is able to form contact holes with pitch less than 140 nm. Of course, if the capability of the lithographic tools allows, the concept of the present invention may also extend to two or more exposures and two or more etchings to form contact holes with even smaller pitch.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
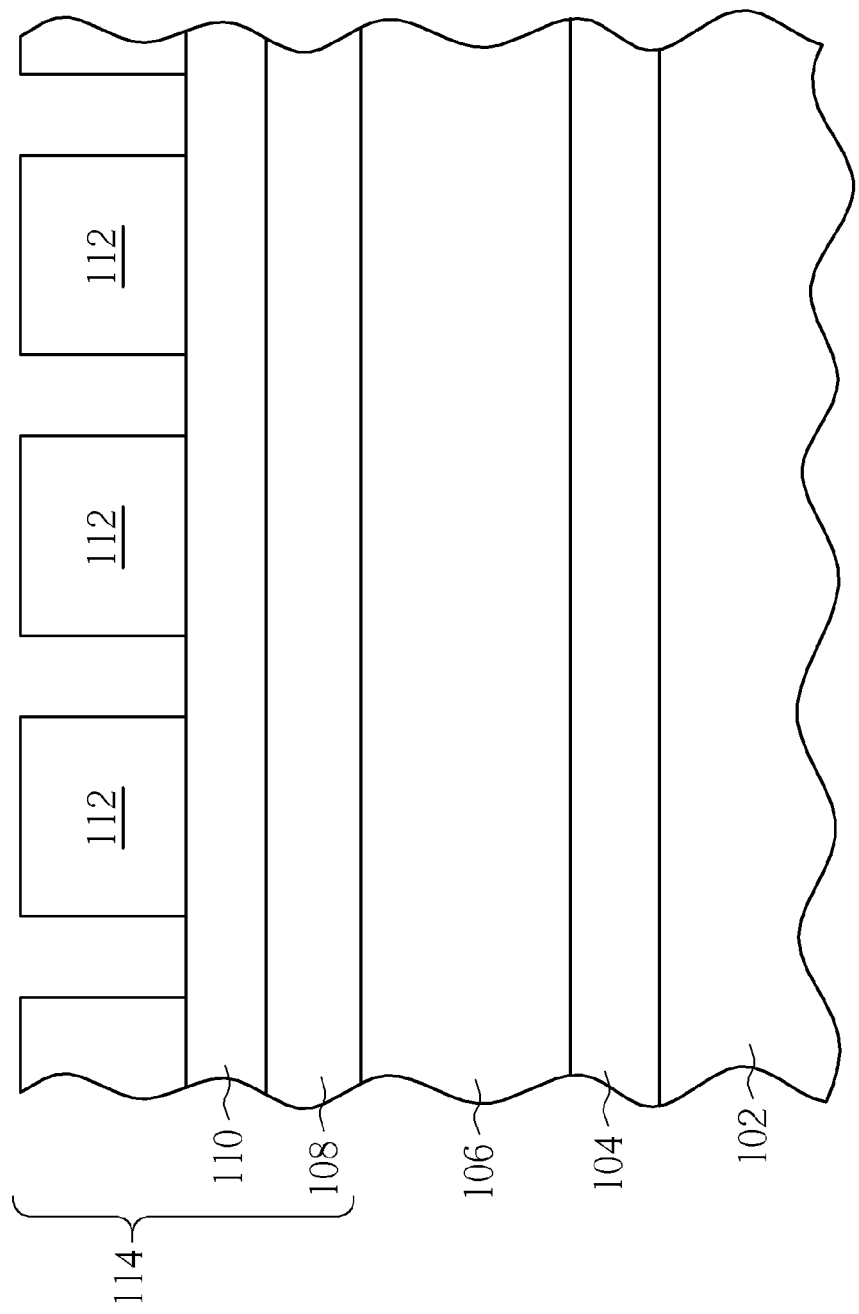
FIG. 1 to FIG. 7 illustrate the perspective view of the method of the contact etch stop layer (CESL) of the first embodiment of the present invention.

Please refer to FIG. 1 to FIG. 7. FIG. 1 to FIG. 7 illustrate the perspective view of the method of the contact etch stop layer (CESL) of the first embodiment of the present invention. As shown in FIG. 1, first a substrate 102 is provided, such as a wafer, or a SOI. Some semiconductor elements such as CMOS are already formed on the substrate 102. Then a contact etching stop layer (CESL) 104, an interlayer dielectric layer (ILD) 106 and a triple stack layer 114 are formed on the substrate 102 sequentially. The triple stack layer 114 comprises a bottom anti-reflective coating (BARC) 108, a silicon-containing photo resist layer 110 and a 193 nm photo resist layer 112. Also, the BARC 108 may be formed by a 365 nm photo resist layer, which is a photo resist of I-line range. The 193 nm photo resist layer 112 is in the range of deep-UV light. In addition, the ILD layer 106 may comprise undoped silicon oxide layer, doped silicon oxide layer such as tetraethylorthosilicate (TEOS), or BPSG, fluoro-silicon-oxide layer, phosphorus-silicon-oxide layer or boron-silicon-oxide layer. The ILD layer 106 may be formed by a plasma-enhanced CVD method. Besides, in the first embodiment, the thickness of the CESL 104 is 850 Å, the thickness of the ILD layer 106 is 3000 Å, the thickness of the BARC 108 is 1800 Å, the thickness of the silicon-containing photo resist layer 110 is 800 Å and the thickness of the 193 nm photo resist layer 112 is 2200 Å. Then an exposure and a development process are performed to pattern the 193 nm photo resist layer 112.

Figure 2:
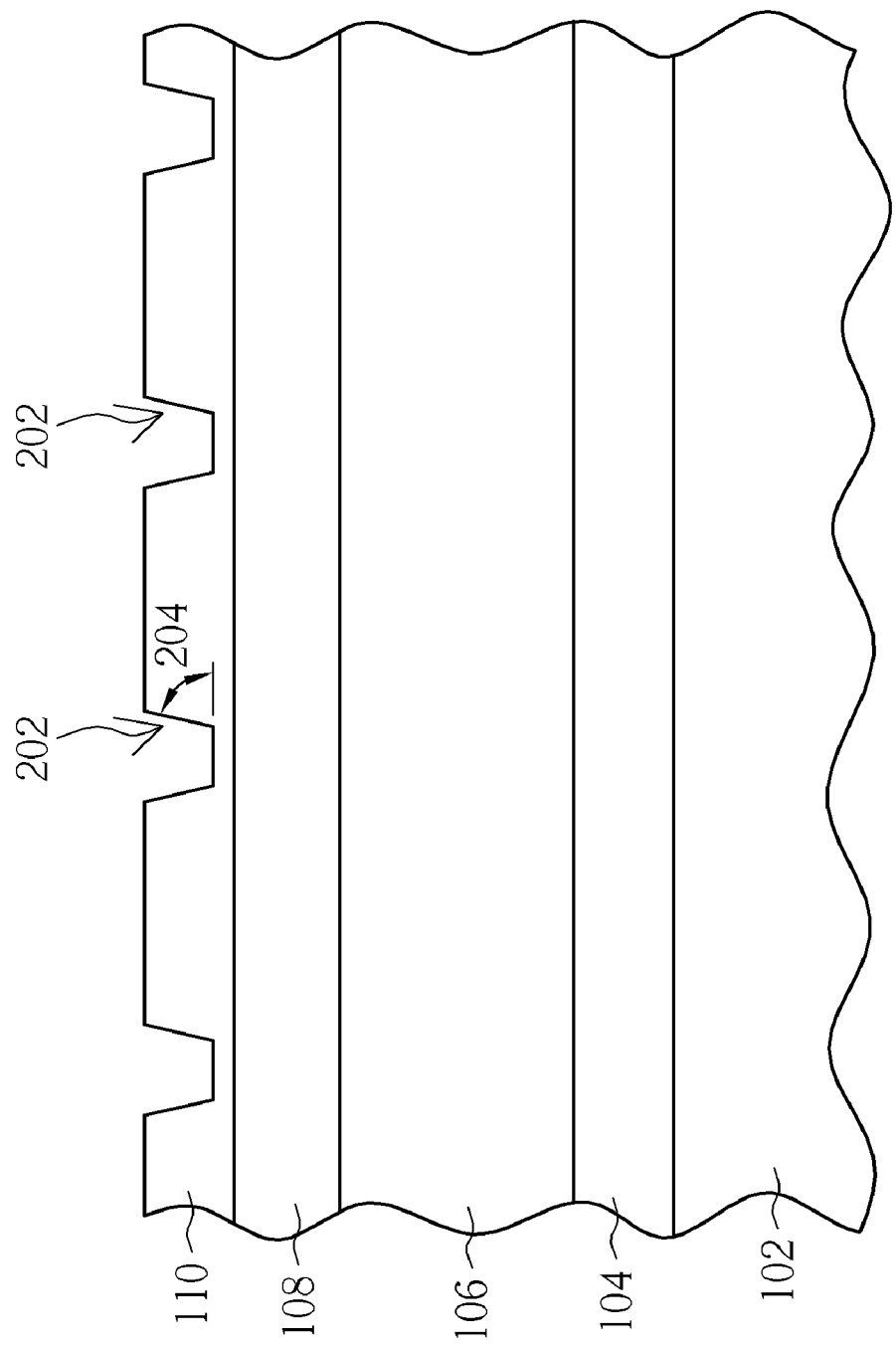

Now please refer to FIG. 2. An etching procedure is performed by adjusting parameters such as etching gas ratio, pressure or power to pattern the silicon-containing photo resist layer 110 by using the patterned 193 nm photo resist layer 112 as an etching mask to obtain several trapezoid openings 202. The sidewalls of every opening 202 are all tapered (taper 204) adjusted by modifying etching parameters and the width of the bottom is smaller than that of the top. Because the depth of each opening 202 is merely 500 Å, the bottom of the opening 202 doesn't expose the BARC 108, which helps to keep the structural integrity of the BARC 108. Later, the residue of the 193 nm photo resist layer 112 is removed.

Figure 3:
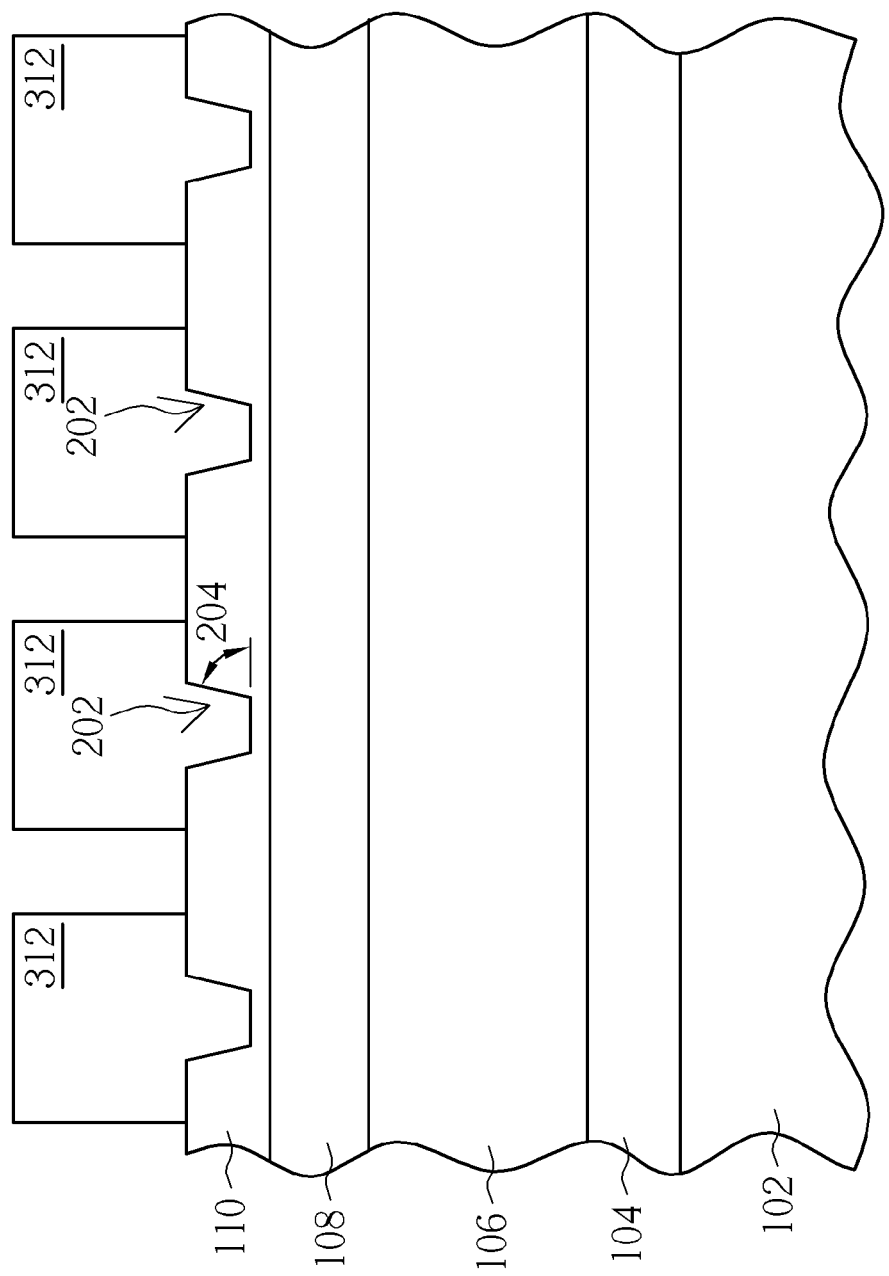

Please refer to FIG. 3. Another 193 nm photo resist layer 312 is formed and fills the openings 202, as shown in FIG. 3. Then another exposure and development process are performed to pattern the 193 nm photo resist layer 312.

Figure 4:
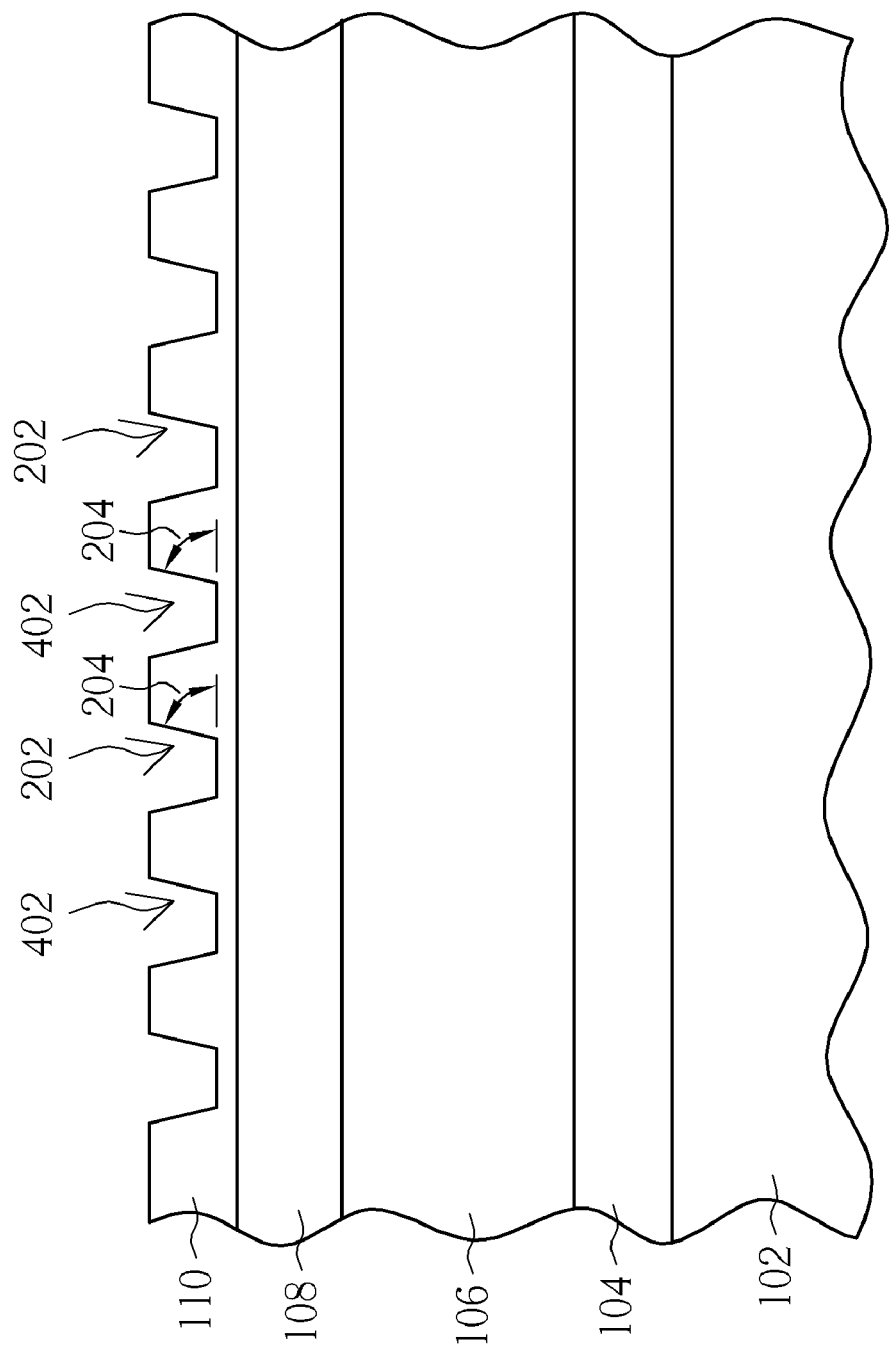

Please refer to FIG. 4. Another etching procedure is performed to pattern the silicon-containing photo resist layer 110 again by using the patterned 193 nm photo resist layer 312 as an etching mask to form a plurality of openings 402. Still, the sidewalls of each opening 402 are tapered (taper 204) because the width of the bottom of the opening 402 is smaller than that of the top. Because the depth of the openings 202 is merely 500 Å, the bottom of the openings 202 doesn't expose the BARC 108, which helps to keep the structural integrity of the BARC 108. Later, the residue of the 193 nm photo resist layer 312 is removed.

Figure 5:
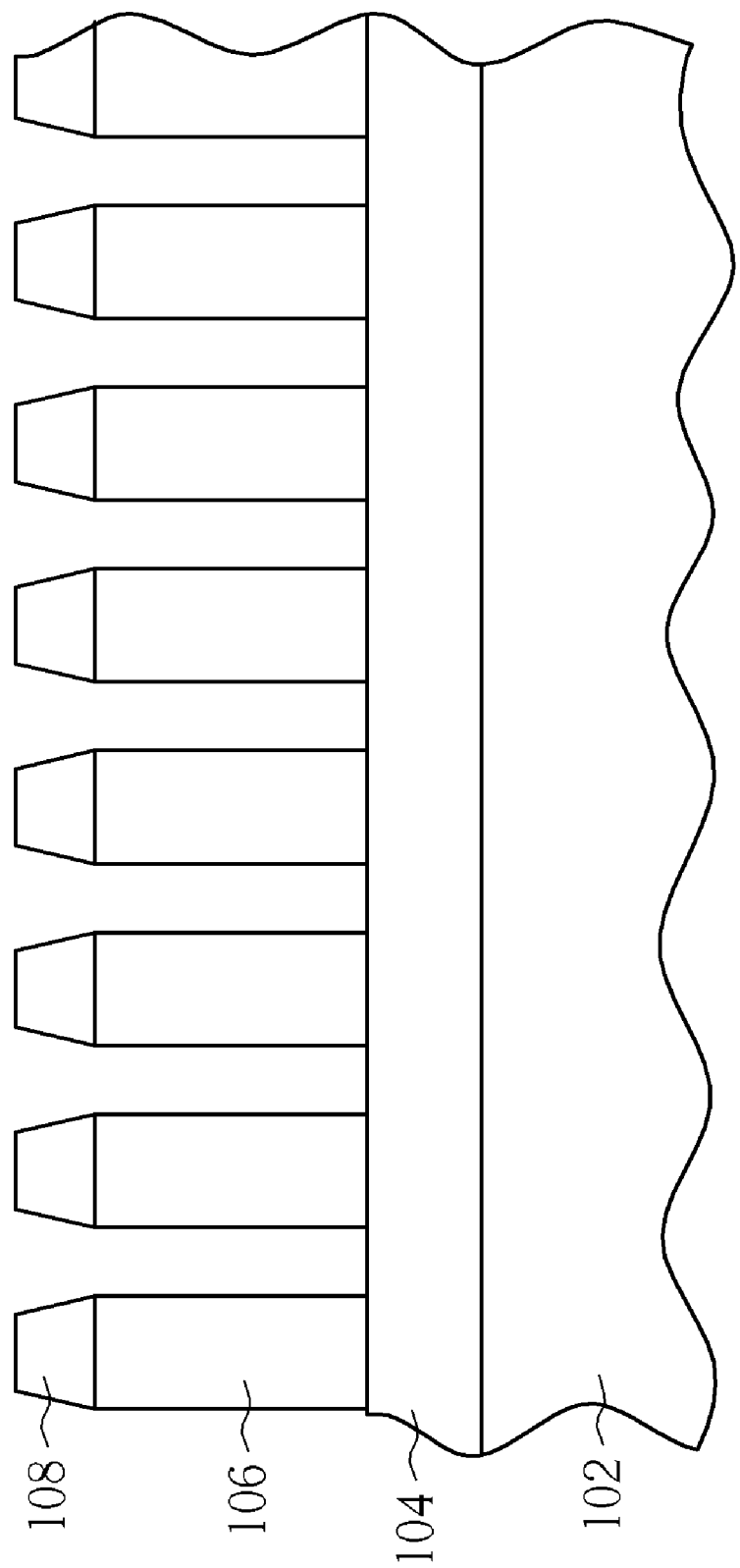

Please refer to FIG. 5. Silicon-containing photo resist layer 110 is directly etched until the silicon-containing photo resist layer 110 is etched through to expose the BARC 108. Later, etching proceeds on the BARC 108 until the ILD layer 106 is exposed. Then, an etching procedure on the ILD layer 106 is performed to expose the CESL 104 by using the patterned BARC 108 as an etching mask. By now the silicon-containing photo resist layer 110 is completely depleted and the BARC 108 is greatly depleted.

Figure 6:
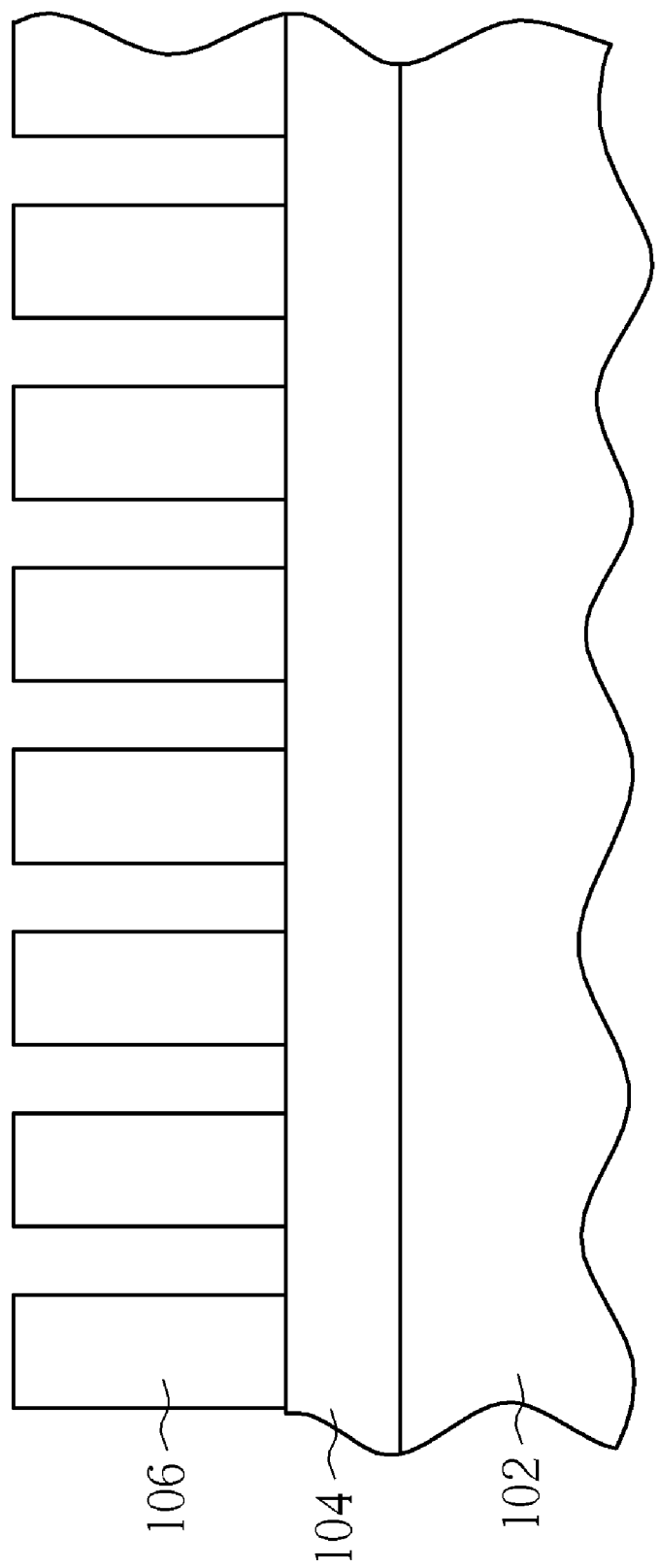
Figure 7:
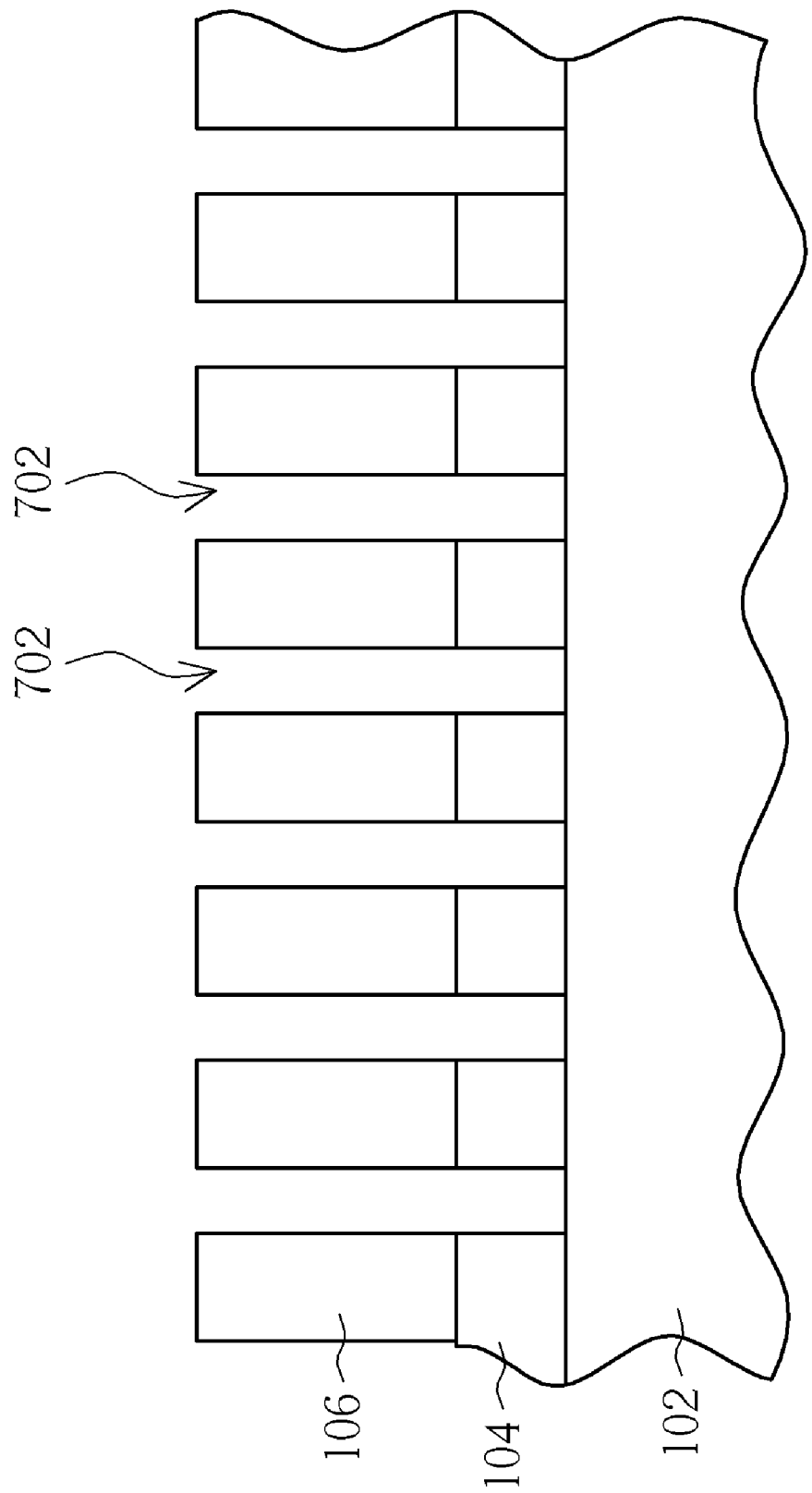

Please refer to FIG. 6. The BARC 108 residue is removed. Then, please refer to FIG. 7, a break-through etching procedure is performed to pattern the CESL 104 by using the patterned ILD layer 106 as an etching mask to form contact holes 702 as shown in FIG. 7.

Please refer to FIG. 8 to FIG. 15. FIG. 8 to FIG. 15 illustrate perspective views of the method of the contact etch stop layer (CESL) of the second embodiment of the present invention. The difference between the second embodiment and the first embodiment resides in an additional metal compound mask layer 1602 between the interlayer dielectric layer (ILD) 106 and the bottom anti-reflective coating (BARC) in the second embodiment.

Figure 8:
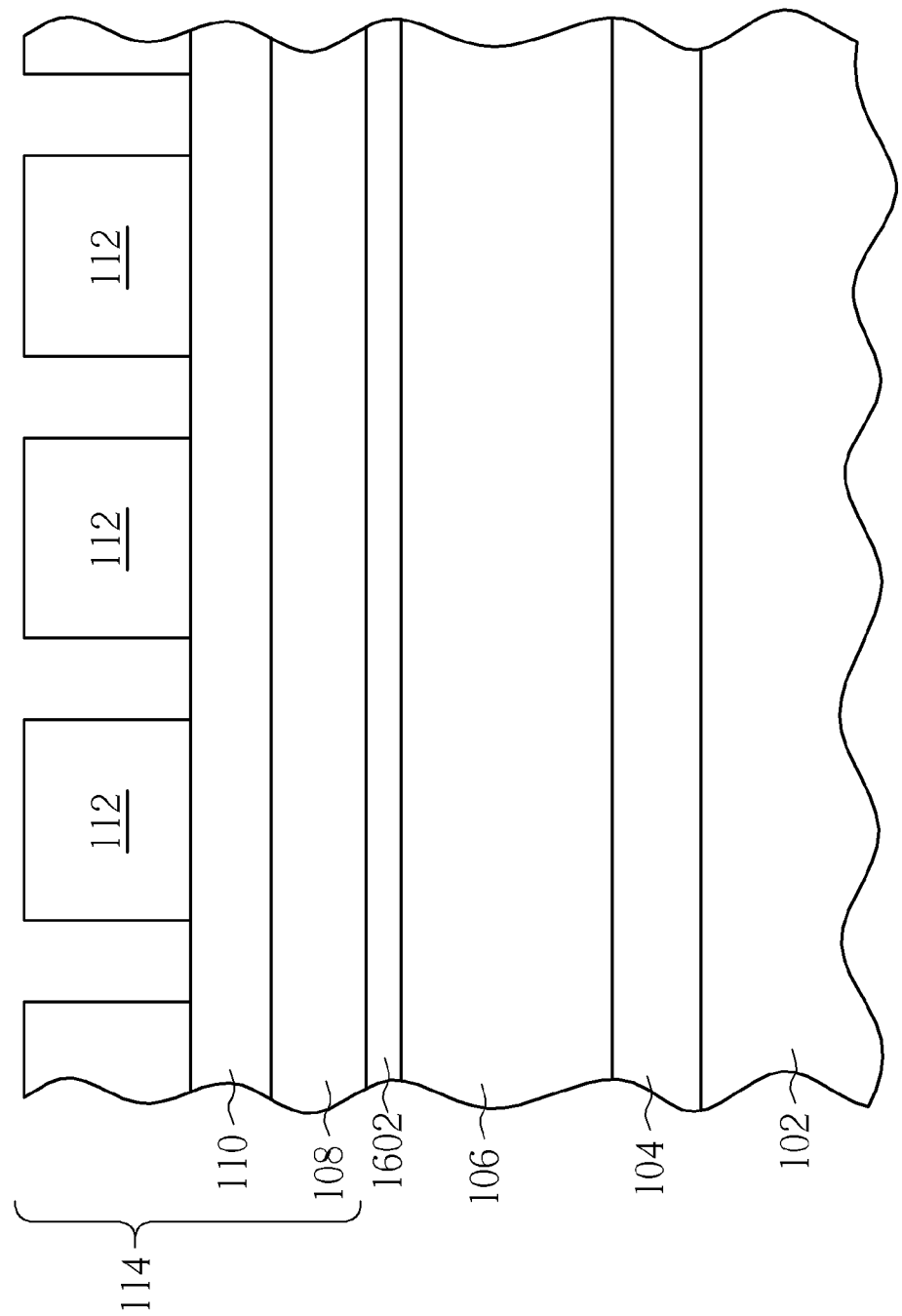
FIG. 8 to FIG. 15 illustrate the perspective view of the method of the contact etch stop layer (CESL) of the second embodiment of the present invention.

First, in FIG. 8 the substrate 102 with some elements formed thereon such as CMOS transistors is provided. Then a contact etching stop layer 104, an interlayer dielectric layer (ILD) 106, a metal compound mask layer 1602 and a triple stack layer 114 are formed on the substrate 102 sequentially. Triple stack layer 114 comprises a bottom anti-reflective coating (BARC) 108, a silicon-containing photo resist layer 110 and a 193 nm photo resist layer 112. Also, the BARC 108 may be a 365 nm photo resist layer. The 193 nm photo resist layer 112 is in the range of deep-UV light. In addition, in the second embodiment the thickness of the CESL 104 is 850 Å, the thickness of the ILD layer 106 is 3000 Å, the thickness of the BARC 108 is 1800 Å, the thickness of the silicon-containing photo resist layer 110 is 800 Å and the thickness of the 193 nm photo resist layer 112 is 2200 Å. First an exposure and a development process are performed to pattern 193 nm photo resist layer 112.

Figure 9:
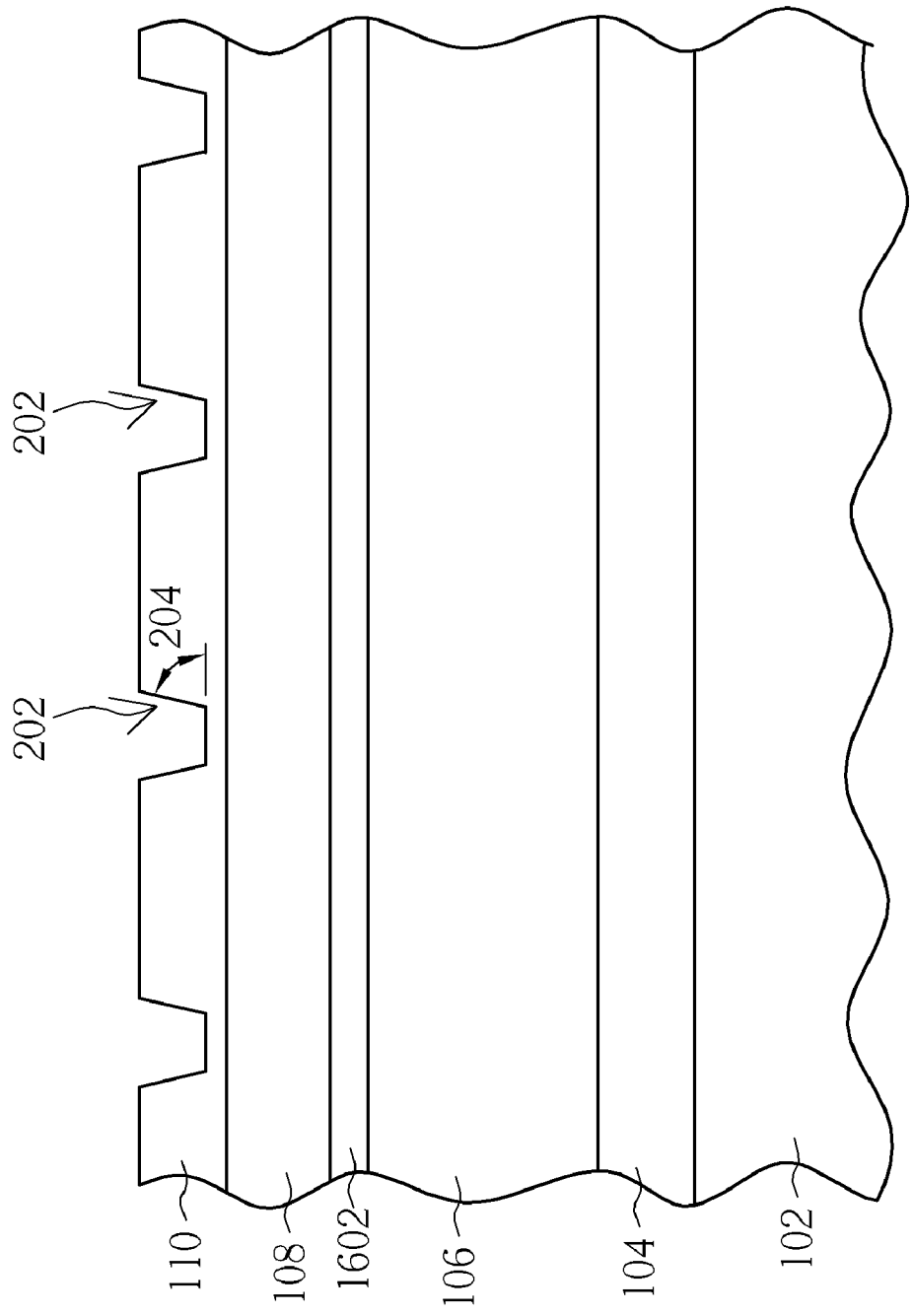

Now please refer to FIG. 9. An etching procedure is performed to pattern the silicon-containing photo resist layer 110 by using patterned the 193 nm photo resist layer 112 as an etching mask. The patterned silicon-containing photo resist layer 110 after etching has several trapezoid openings 202 and the width of the bottom of the openings 202 is smaller than that of the top and the sidewalls are all tapered (taper 204). Because the depth of the openings 202 is merely 500 Å, the bottom of the openings 202 doesn't expose the BARC 108, which helps to keep the structural integrity of the BARC 108. Later, the residue of the 193 nm photo resist layer 112 is removed.

Figure 10:
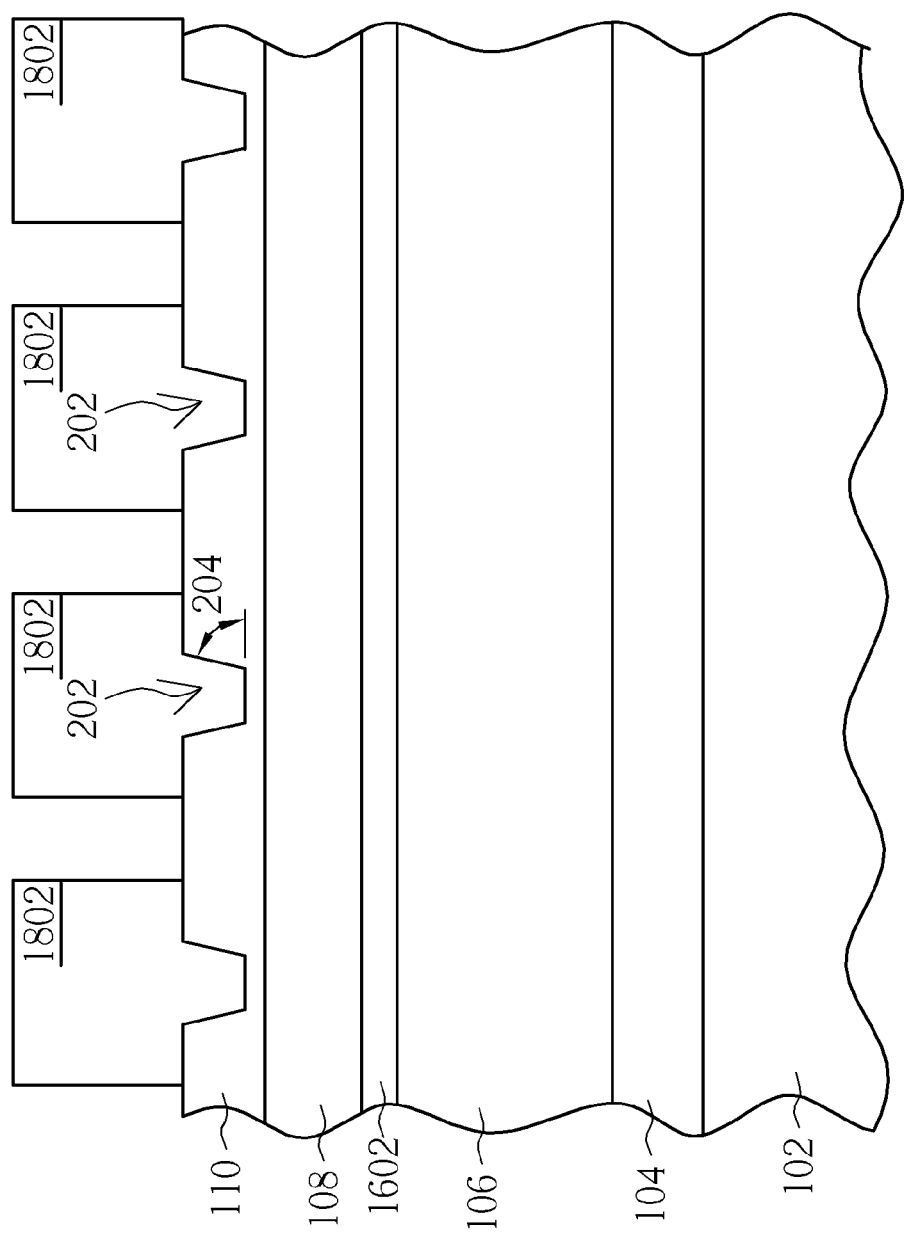
Figure 11:
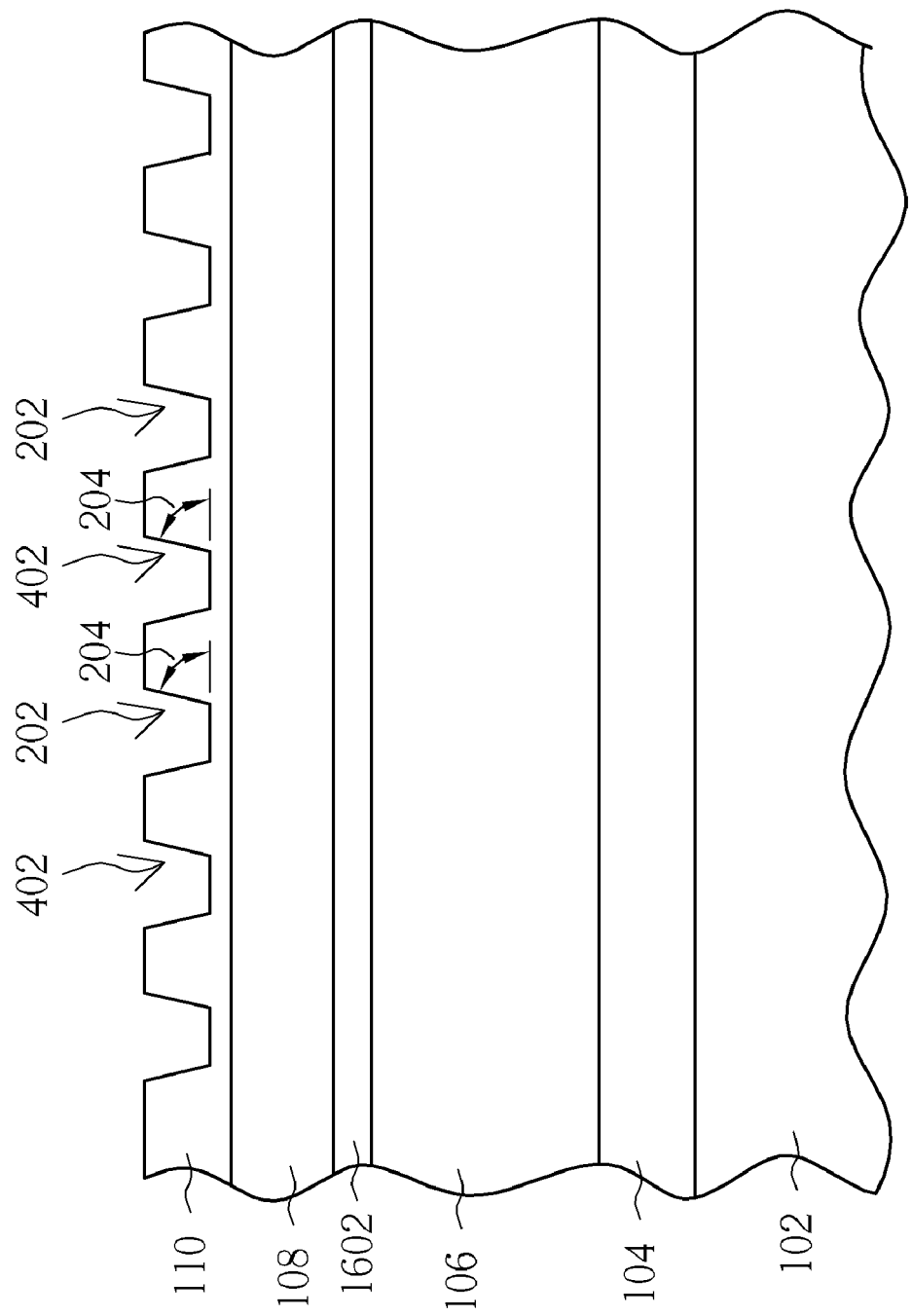

Please refer to FIG. 10. Another 193 nm photo resist layer 312 is formed and accordingly fills the openings 202. Then another exposure and development process is performed to pattern the 193 nm photo resist layer 312. Please refer to FIG. 11. Another etching procedure is performed to again pattern the silicon-containing photo resist layer 110 by using the patterned 193 nm photo resist layer 312 as an etching mask to form a plurality of openings 402. Still, the sidewalls of the opening 402 are all tapered (taper 204) and the width of the bottom of each opening 402 is smaller than that of the top. Besides, because the depth of the openings 202 is merely 500 Å, the bottom of the openings 202 doesn't expose the BARC 108, which helps to keep the structural integrity of the BARC 108. Later, the residue of the 193 nm photo resist layer 312 is removed.

Figure 12:
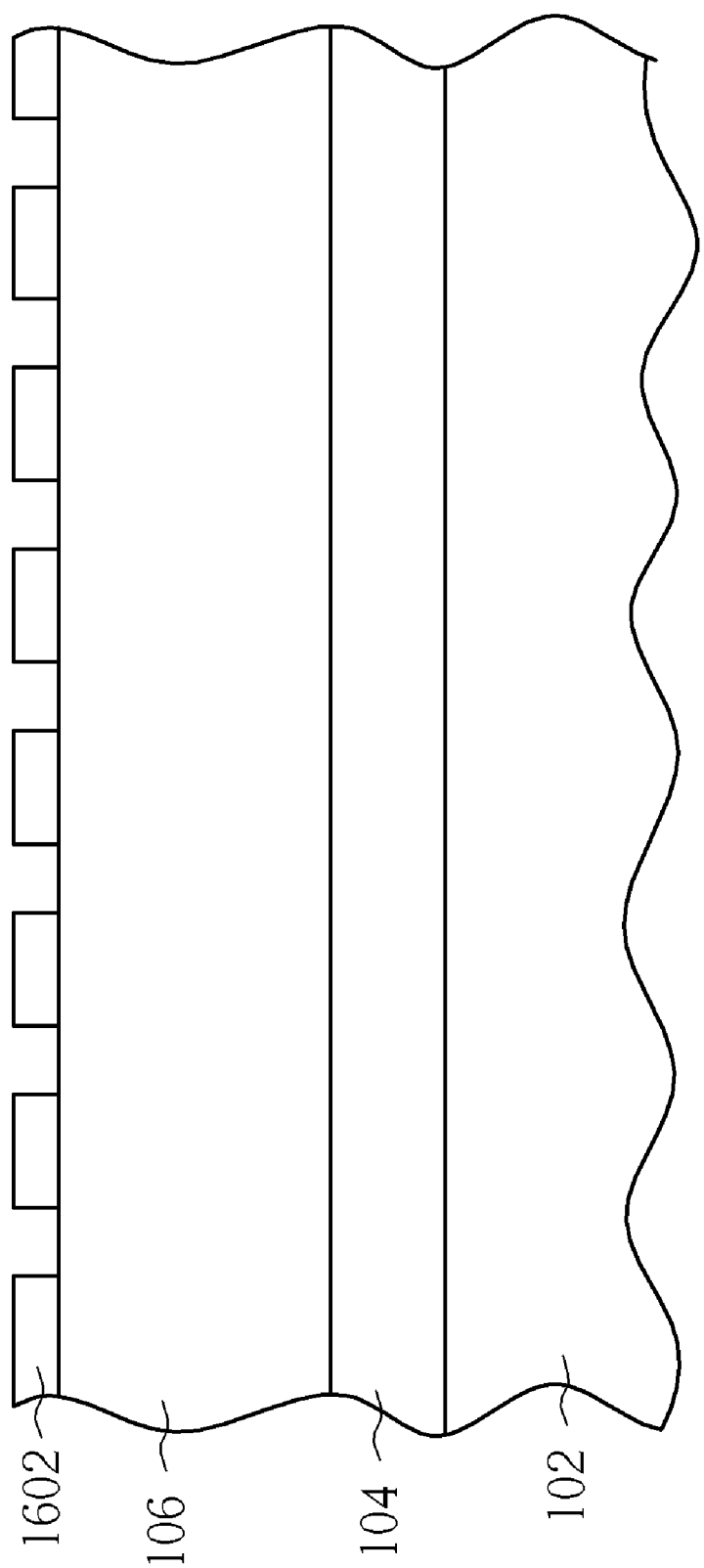

Please refer to FIG. 12. The silicon-containing photo resist layer 110 is directly etched until the BARC 108 is exposed. Later, an etching procedure on the BARC 108 is performed to expose the metal compound mask layer 1602 by using the patterned silicon-containing photo resist layer 110 as an etching mask. Then, another etching procedure on the metal compound mask layer 1602 is performed to pattern the metal compound mask layer 1602 by using the patterned BARC 108 as an etching mask. Afterwards, all the photo resist layers above the metal compound mask layer 1602 are removed.

Figure 13:
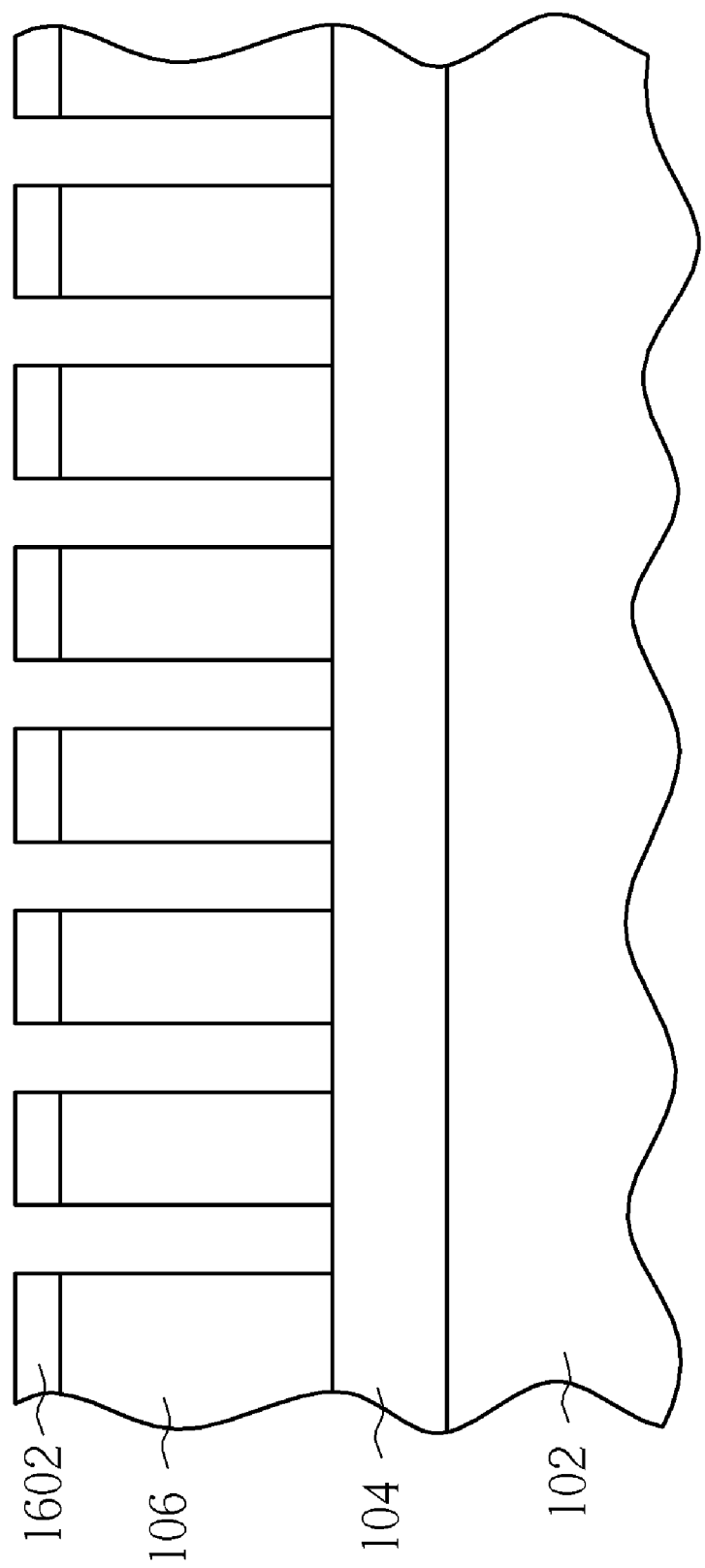

Please refer to FIG. 13. The ILD 106 is etched by using the patterned metal compound mask layer 1602 as an etching mask to form the patterned ILD 106 and to expose the CESL 104.

Figure 14:
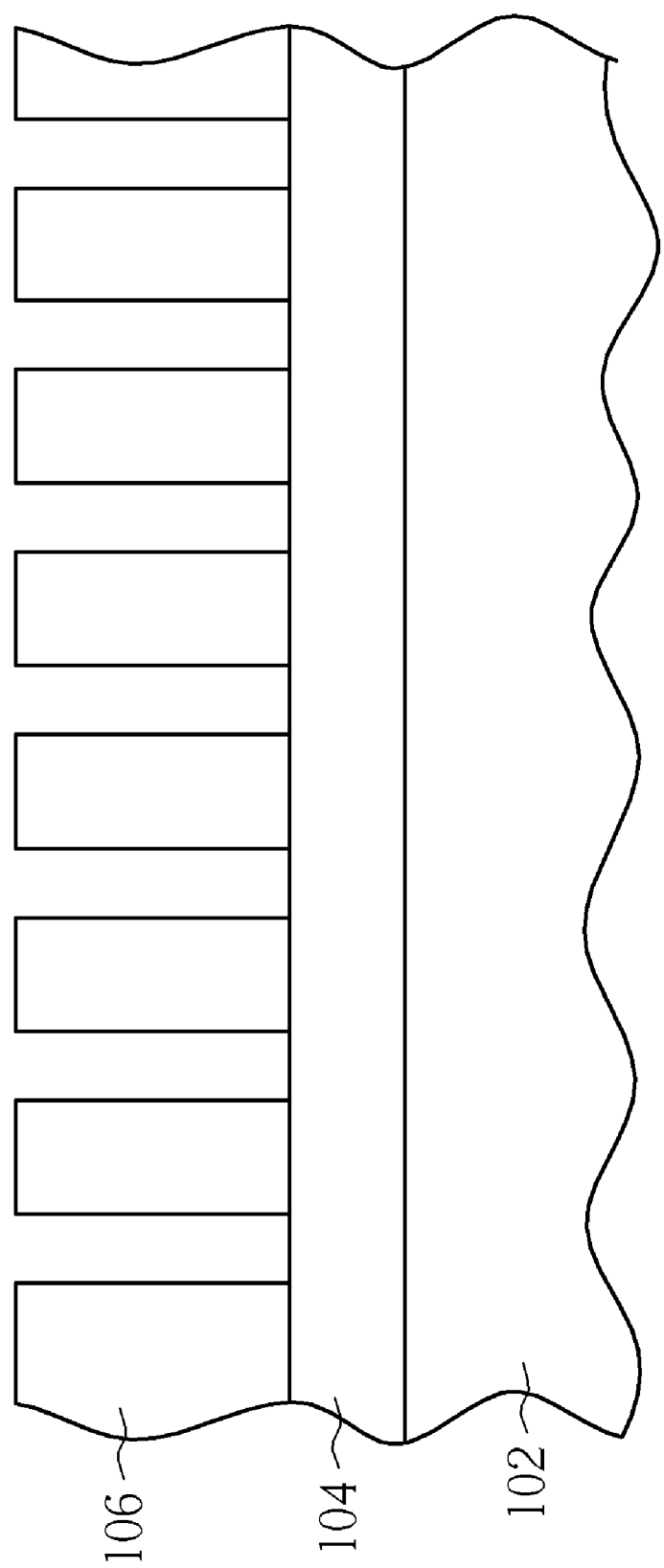
Figure 15:
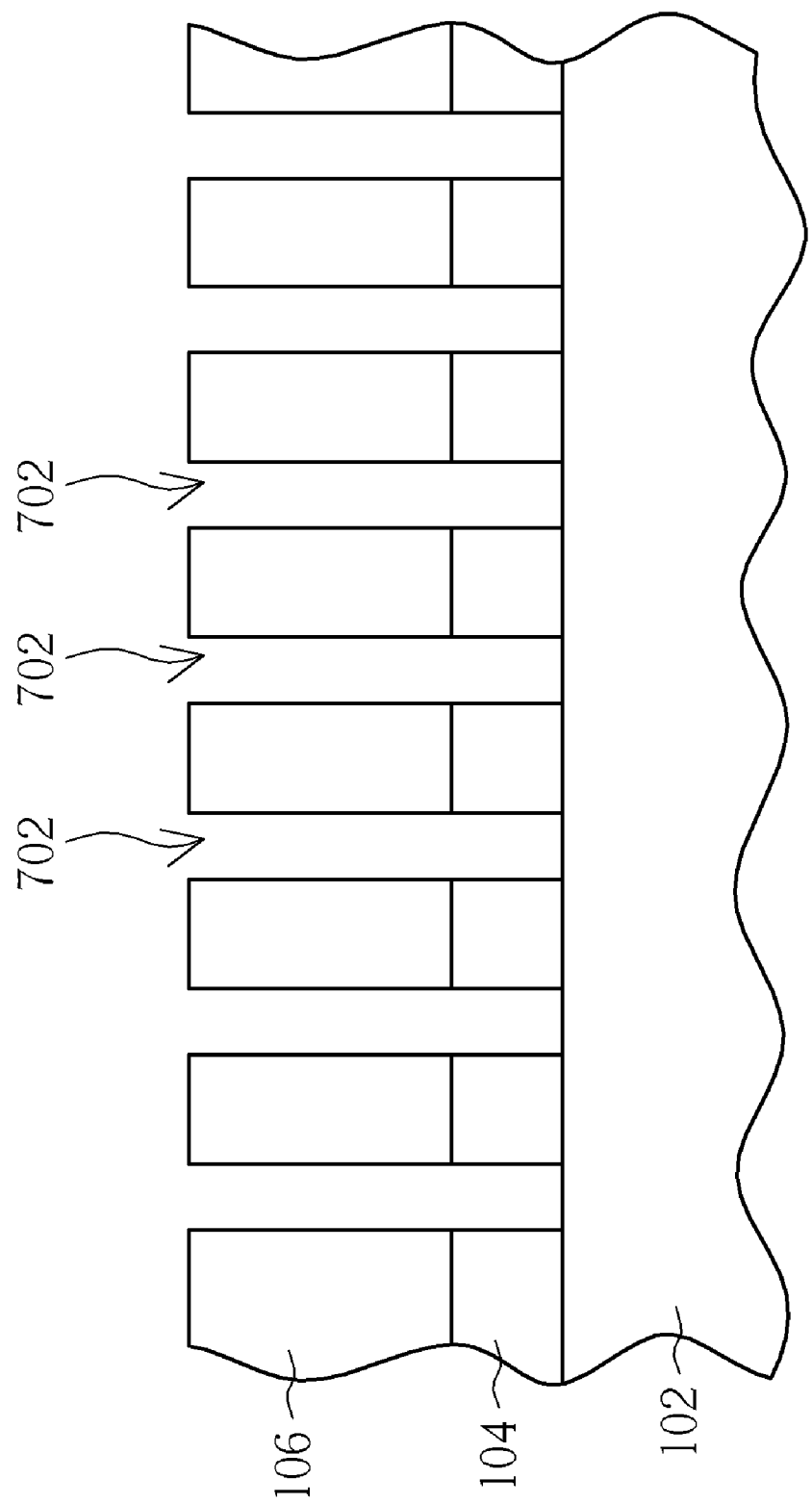

Please refer to FIG. 14, in which the patterned metal compound mask layer 1602 is removed. Following that, please refer to FIG. 15, a break-through etching procedure is performed to pattern the CESL 104 by using the patterned ILD layer 106 as an etching mask to form contact holes 702 as shown in FIG. 15.

Figure 16:
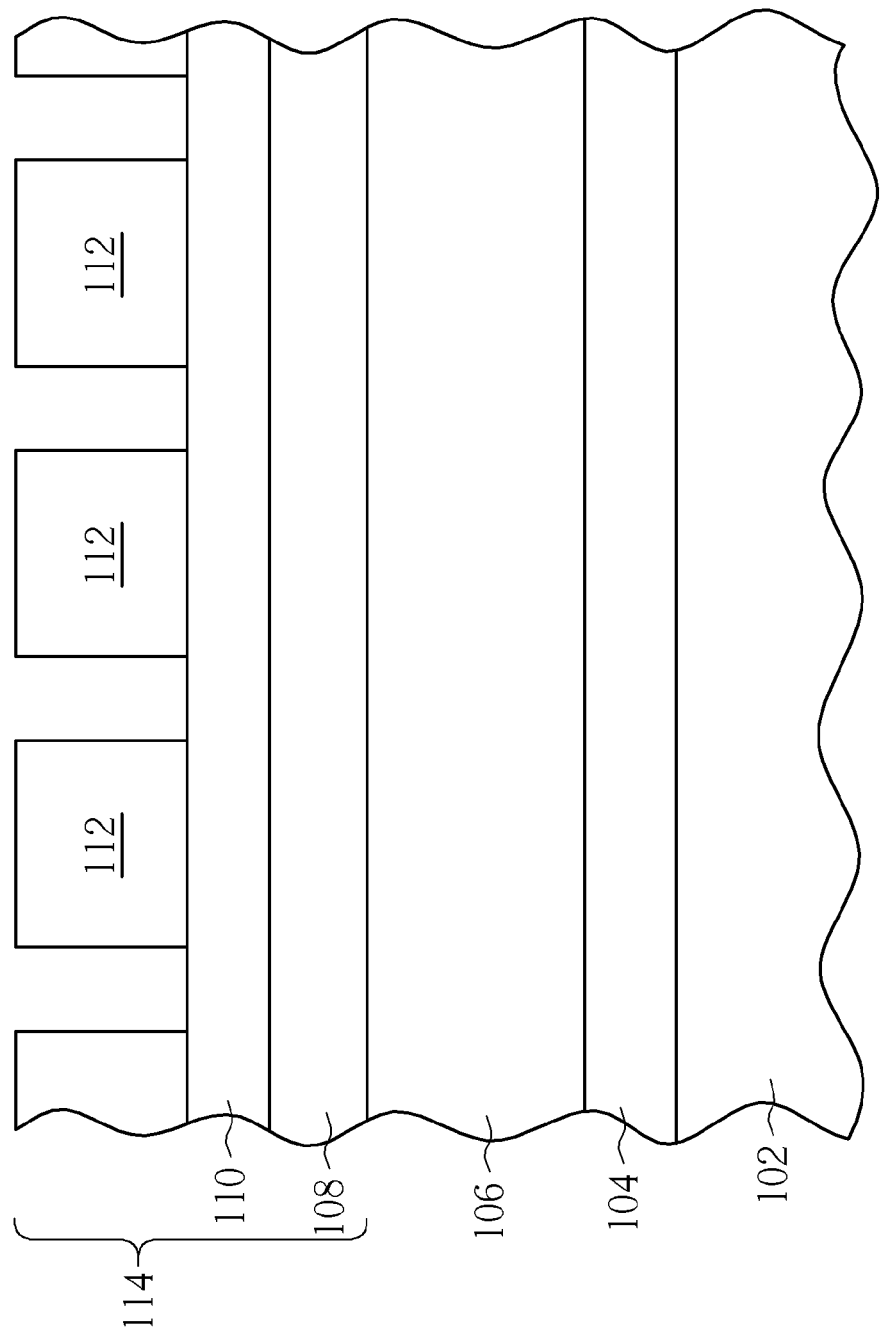
FIG. 16 to FIG. 23 illustrate the perspective view of the method of the contact etch stop layer (CESL) of the third embodiment of the present invention.

Please refer to FIG. 16 to FIG. 23. FIG. 16 to FIG. 23 illustrate the perspective view of the method of the contact etch stop layer (CESL) of the third embodiment of the present invention. Similarly, as shown in FIG. 16, a substrate 102 with some elements such as CMOS transistors formed thereon is provided. A contact etching stop layer 104, an interlayer dielectric layer (ILD) 106 and a triple stack layer 114 are formed on the substrate 102 sequentially. The triple stack layer 114 comprises a bottom anti-reflective coating (BARC) 108, a silicon-containing photo resist layer 110 and a 193 nm photo resist layer 112. The BARC 108 may be a 365 nm photo resist layer 108. In addition, in the third embodiment the thickness of CESL 104 is 850 Å, the thickness of the ILD layer 106 is 3000 Å, the thickness of the BARC 108 is 1800 Å, the thickness of the silicon-containing photo resist layer 110 is 800 Å and the thickness of the 193 nm photo resist layer 112 is 2200 Å. First an exposure and a development process are performed to pattern the 193 nm photo resist layer 112.

Figure 17:
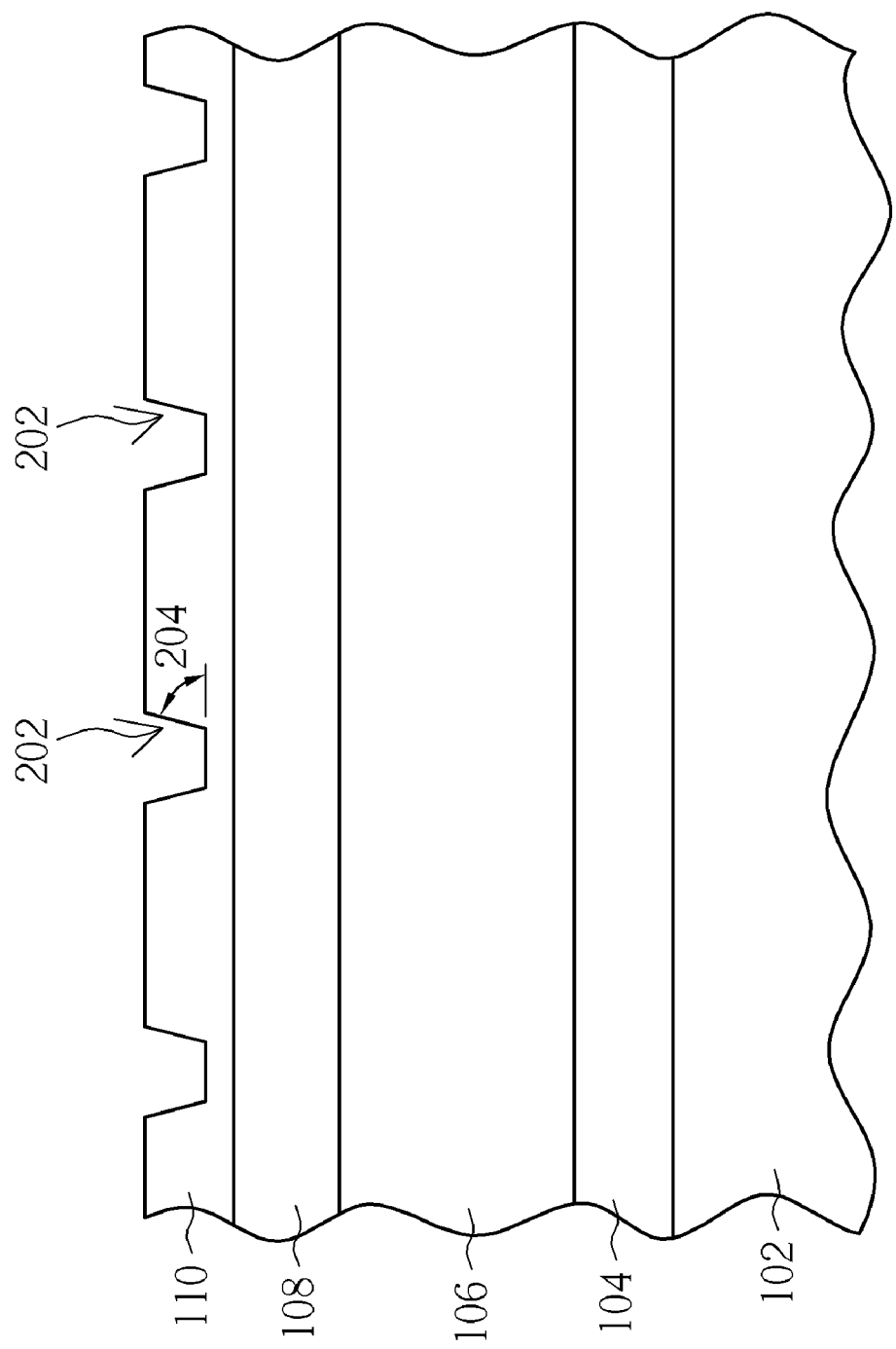

Now please refer to FIG. 17. An etching procedure is performed to pattern the silicon-containing photo resist layer 110 by using the patterned 193 nm photo resist layer 112 as an etching mask. The patterned silicon-containing photo resist layer 110 after etching has several trapezoid openings 202. The sidewalls of every opening 202 are all tapered (taper 204) and the width of the bottom of the openings 202 is smaller than that of the top. Because the depth of the openings 202 is merely 500 Å, the bottom of the openings 202 doesn't expose the BARC 108, which helps to keep the structural integrity of the BARC 108. Later, the residue of the 193 nm photo resist layer 112 is removed.

Figure 18:
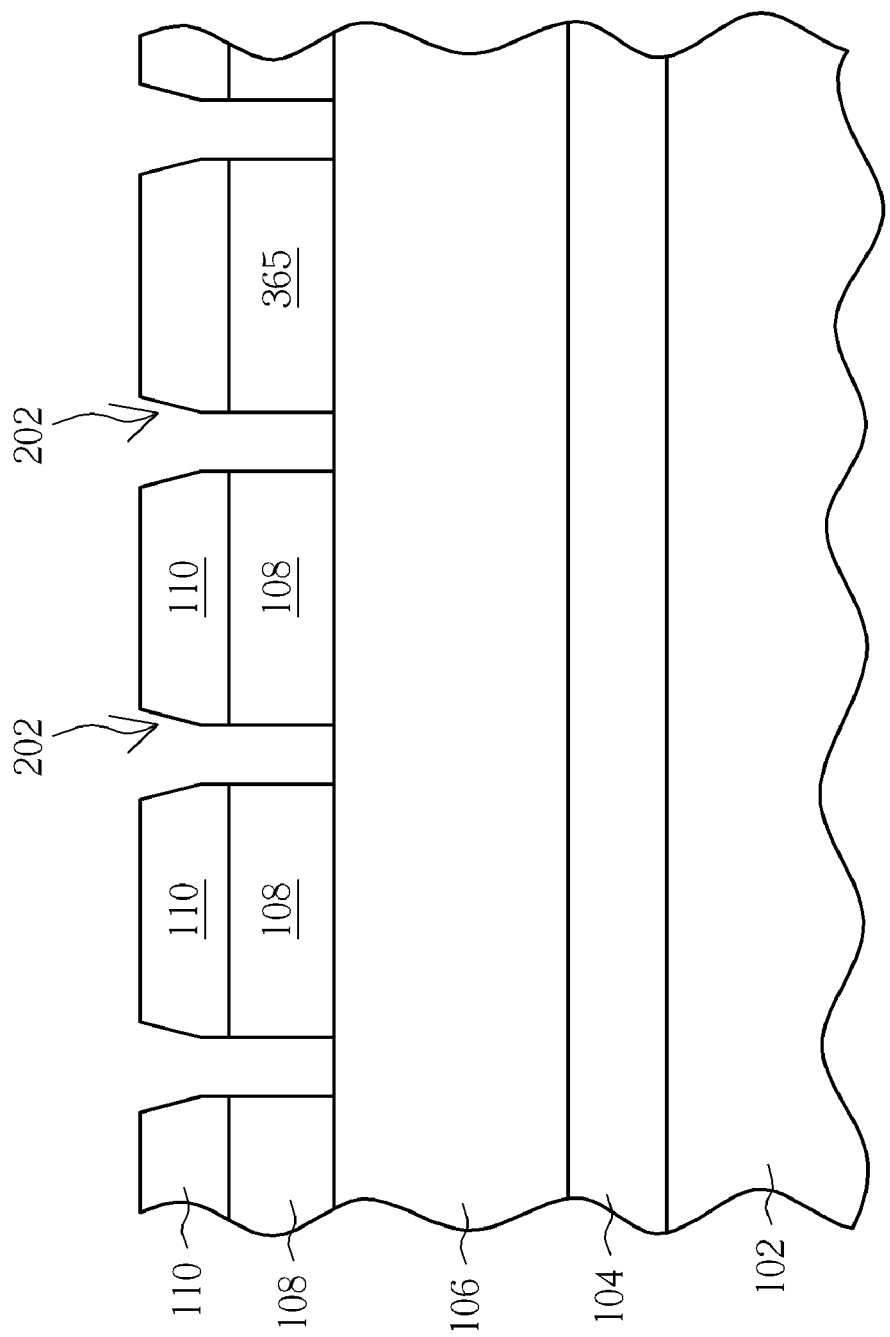

Please refer to FIG. 18. Another etching procedure is performed on the silicon-containing photo resist layer 110 to expose the BARC 108 by using the patterned silicon-containing photo resist layer 110 as an etching mask. This etching procedure depletes the silicon-containing photo resist layer 110 from original 800 Å to 500 Å. Please notice that because the width of the bottom of the openings 202 is smaller than that of the top, the width of the bottom is used as reference. Later, an etching procedure on the BARC 108 is performed to expose the ILD 106 and to pattern the BARC 108 by using the etched silicon-containing photo resist layer 110 as an etching mask. Generally speaking, the silicon-containing photo resist layer 110 after the etching procedure on the BARC 108 is completely depleted.

Figure 19:
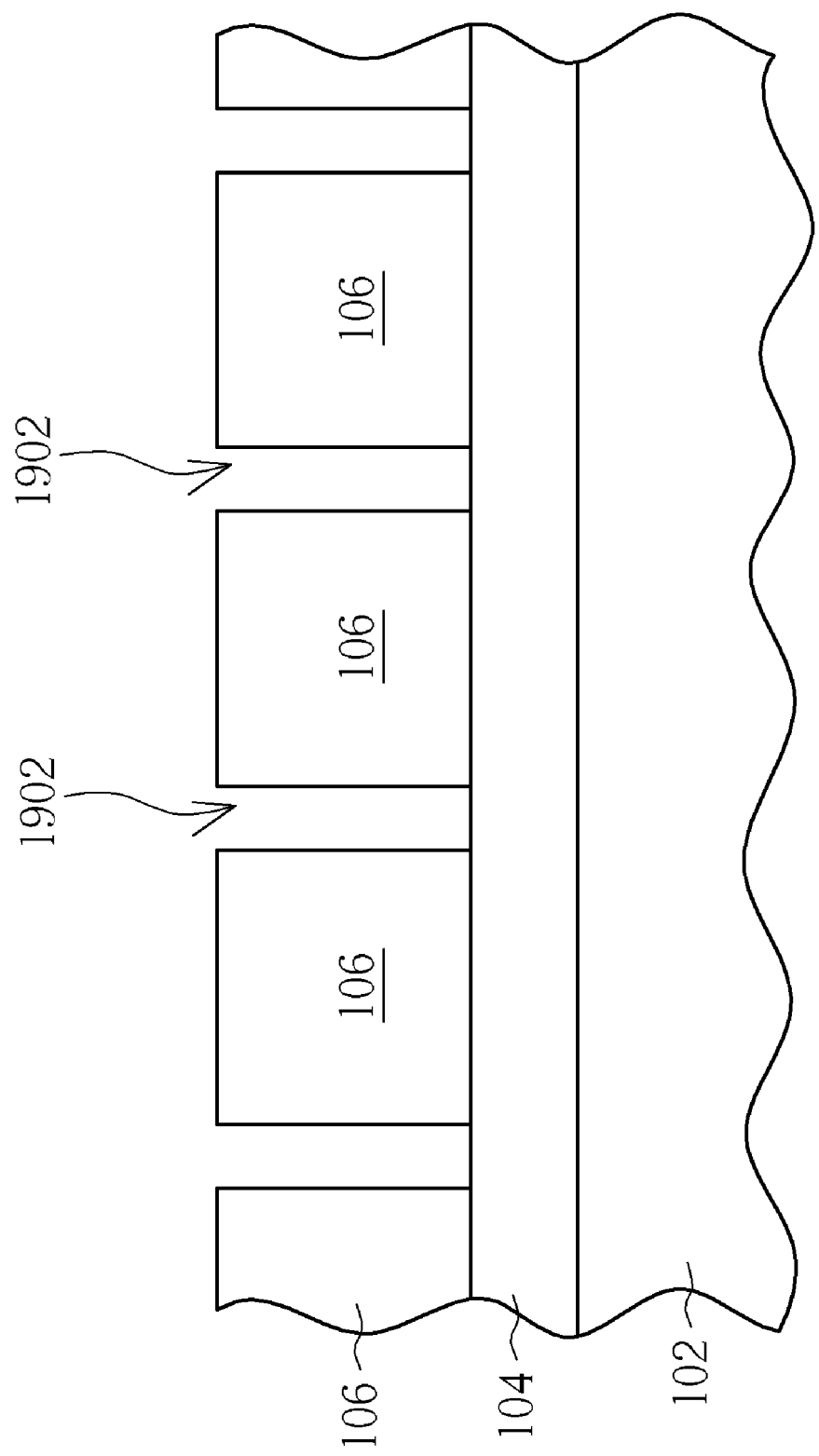

Please refer to FIG. 19. The ILD 106 is etched by using the patterned BARC 108 as an etching mask to expose the CESL 104 and to form a plurality of openings 1902. Afterwards, the BARC 108 on the ILD 106 is removed.

Figure 20:
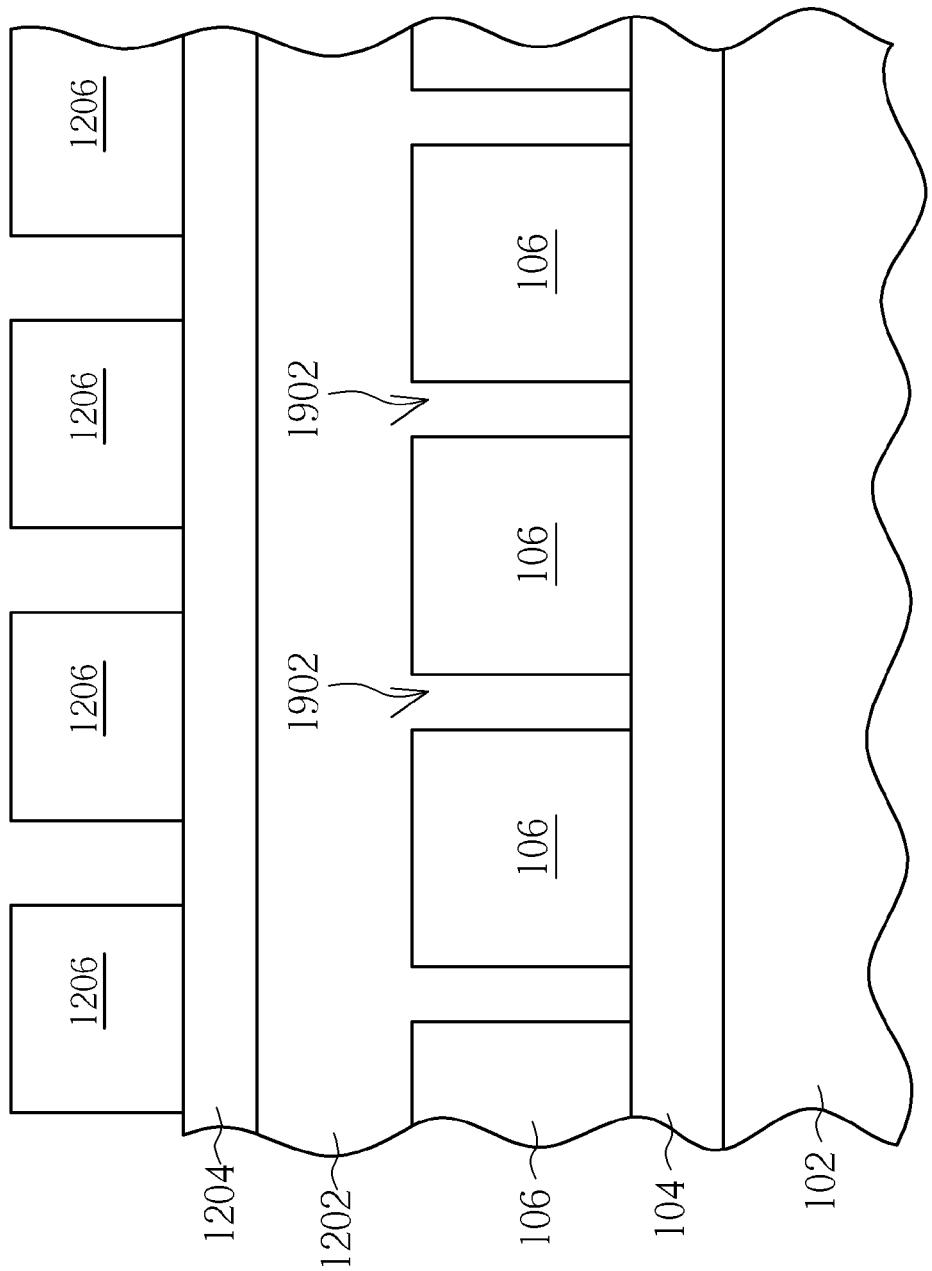
Figure 21:
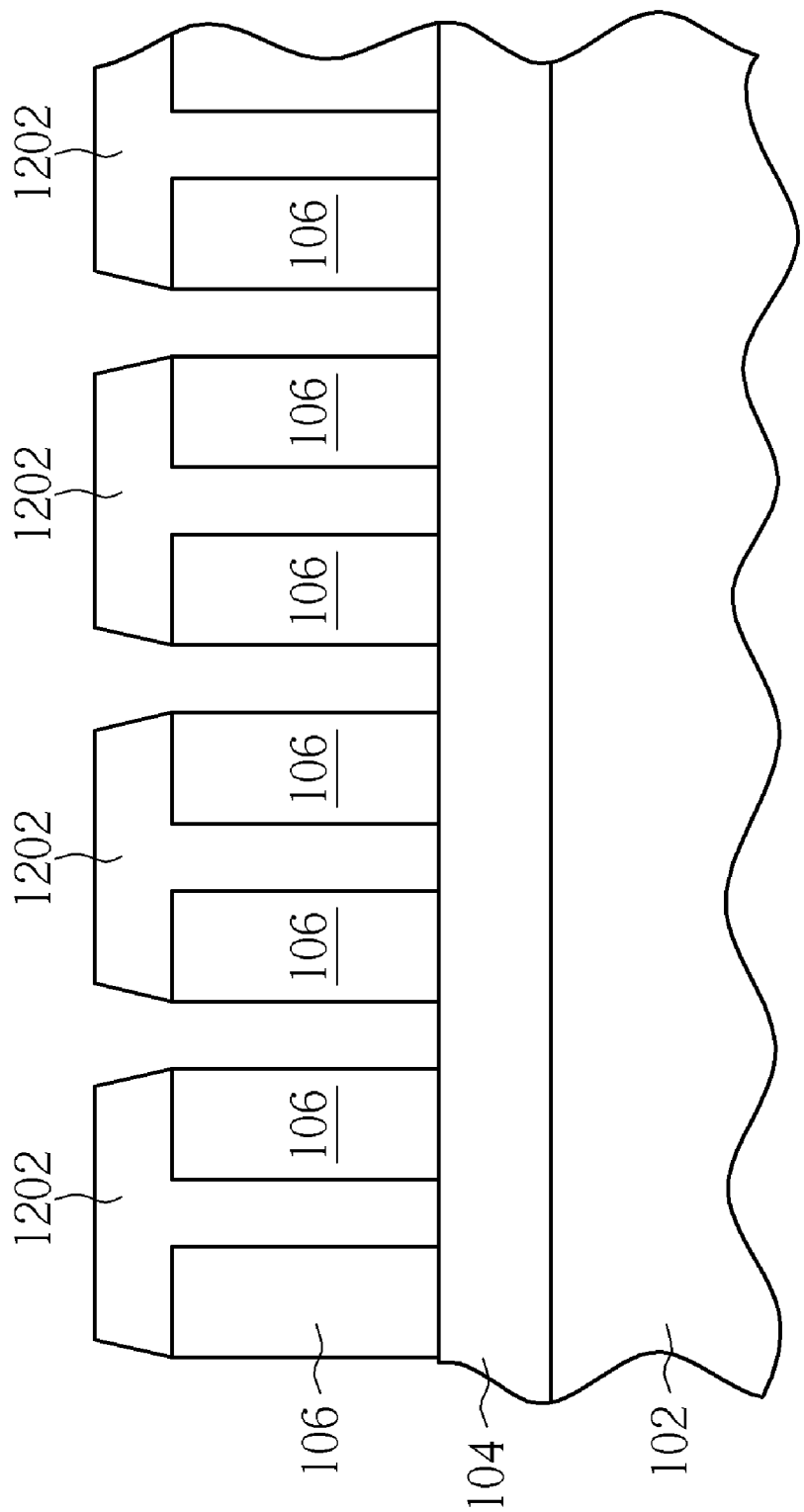

Please refer to FIG. 20. Another bottom anti-reflective coating (BARC) 1202, silicon-containing photo resist layer 1204 and 193 nm photo resist layer 1206 are formed on the patterned ILD 106 sequentially and the BARC 1202 fills every opening 1902. Following that, as shown in FIG. 16, the 193 nm photo resist layer 1206 is exposed and developed to pattern the 193 nm photo resist layer 1206 but the exposed regions are different from those in FIG. 16.

The following steps are similar to those in FIG. 17 to FIG. 19. An etching procedure is performed to pattern the silicon-containing photo resist layer 1204 by using the patterned 193 nm photo resist layer 1206 as an etching mask. Then, another etching procedure is performed on the silicon-containing photo resist layer 1204 to expose the BARC 1202 by using the patterned silicon-containing photo resist layer 1204 as an etching mask. Afterwards, still another etching procedure is performed on the BARC 1202 to expose the ILD 106 and to pattern the BARC 1202 by using the etched silicon-containing photo resist layer 1204 as an etching mask. Later, an etching procedure is performed on the ILD 106 to expose the CESL 104 by using the patterned BARC 1202 as an etching mask. By now, the silicon-containing photo resist layer 1204 is completely depleted during the etching procedure but still some of the BARC 1202 is left behind to form the structure shown in FIG. 21.

Figure 22:
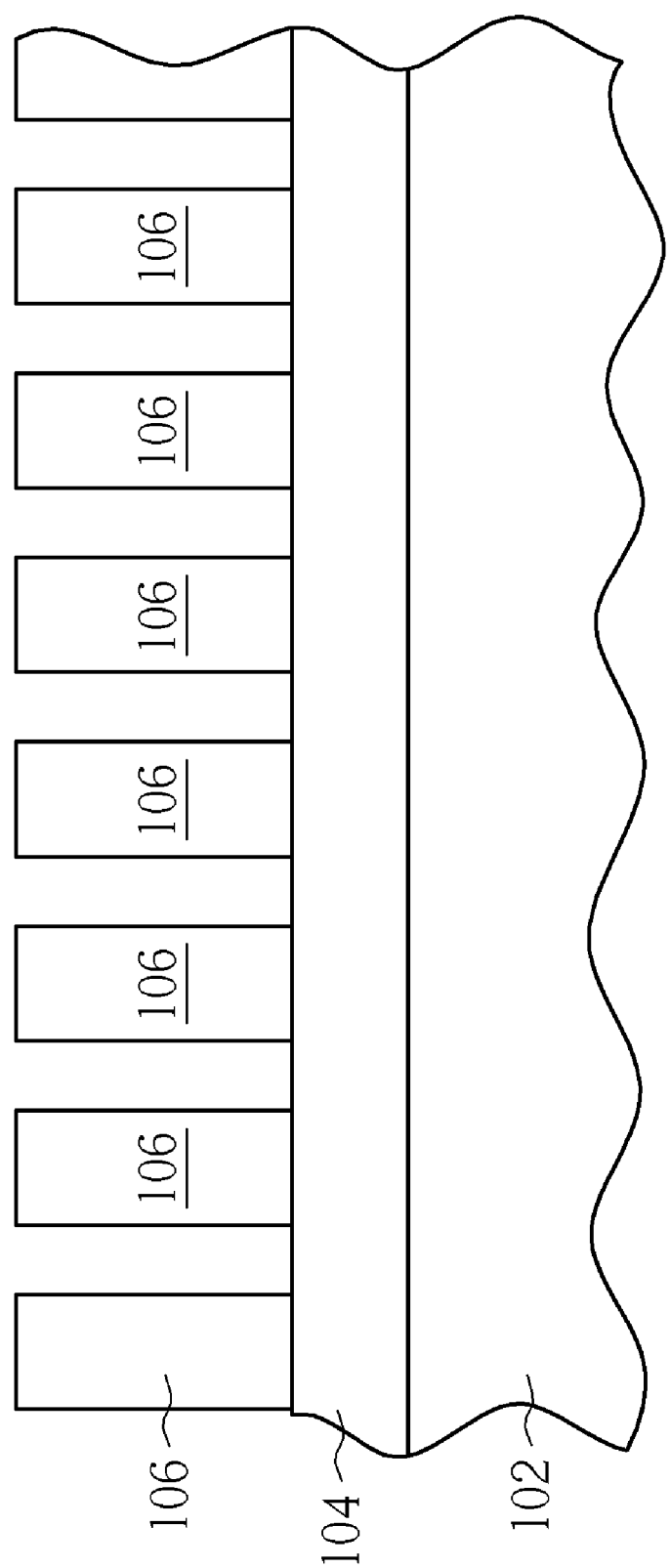
Figure 23:
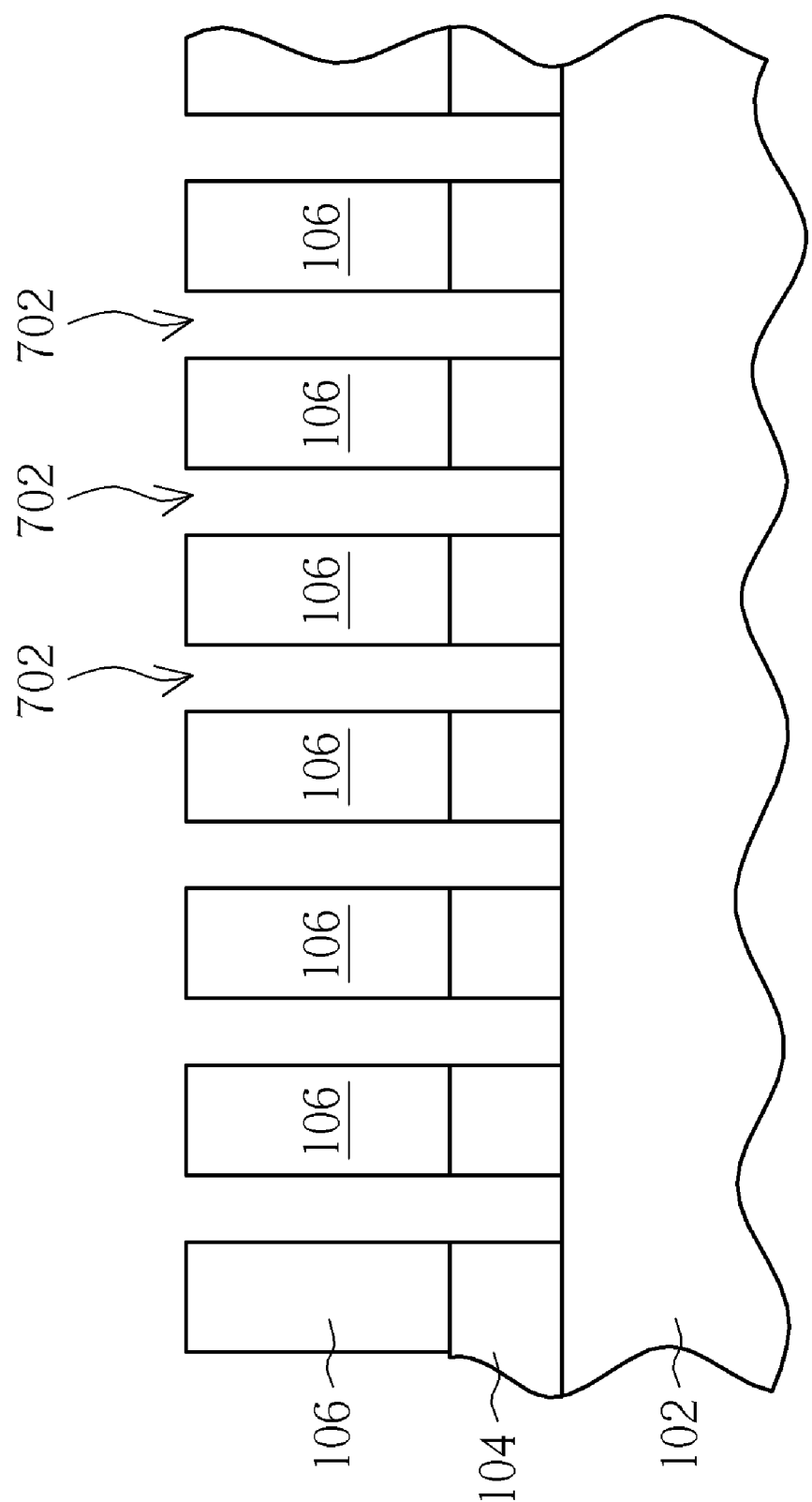

Please refer to FIG. 22. Now the BARC 1202 on the ILD 106 is removed. Then in FIG. 23 a break-through etching procedure is performed to pattern the CESL 104 by using the patterned ILD layer 106 as an etching mask to form contact holes 702 as shown in FIG. 23.

The prior art uses the technique of two exposures on the same photo resist layer, but it is futile because it is beyond the capability of the current lithographic tools. However, compared with the prior art technique, the present invention utilizes a different strategy. First, an etching step is directly performed after a first exposure to transfer the pattern defined by the first exposure onto a silicon-containing photo resist layer or an interlayer dielectric layer. Following that, a newly defined pattern is again transferred onto the silicon-containing photo resist layer or the interlayer dielectric layer after another exposure at different locations on the newly formed photo resist layer. Such two-exposures-and-two-etchings method is capable of forming contact holes with pitch less than 140 nm. Of course, if the capability of the lithographic tools allows, the concept of the present invention may also extend to two or more exposures and two or more etchings to form contact holes with even smaller pitch.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for forming a contact hole, comprising:
providing a substrate to form an interlayer dielectric layer and a first silicon-containing photo resist layer thereon sequentially;
forming a first photo resist pattern on said first silicon-containing photo resist layer;
performing a first etching procedure on said first silicon-containing photo resist layer to form a plurality of first openings by using said first photo resist pattern as an etching mask;
removing said first photo resist pattern;
performing an etching procedure to form a plurality of first contact holes in said interlayer dielectric layer by using said first openings as an etching mask and removing said first silicon-containing photo resist layer;
forming a second silicon-containing photo resist layer on said interlayer dielectric layer;
forming a second photo resist pattern on said second silicon-containing photo resist layer; and
performing an etching procedure to form a plurality of second contact holes in said interlayer dielectric layer by using said second photo resist pattern as an etching mask.

2. The method of claim 1 wherein said first silicon-containing photo resist layer is a photo resist layer of 10-30% silicon.

3. The method of claim 2 wherein a first 365 nm photo resist layer is disposed between said first silicon-containing photo resist layer and said interlayer dielectric layer.

4. The method of claim 2 wherein a bottom anti-reflective coating (BARC) is disposed between said silicon-containing photo resist layer and said interlayer dielectric layer.

5. The method of claim 4 wherein said first photo resist pattern is formed by using a first 193 nm photo resist layer through an exposure and development procedure.

6. The method of claim 5 wherein after forming said first contact holes, the method further comprises:
  forming a second 365 nm photo resist layer on said interlayer dielectric layer and filling said first contact holes;
  forming a second silicon-containing photo resist layer and a second 193 nm photo resist layer on said second 365 nm photo resist layer sequentially; and
  exposing and developing said second 193 nm photo resist layer to form said second photo resist patterns.

7. The method of claim 6 wherein the sidewalls of said first and said second openings are all tapered and the width of the bottom is smaller than that of the top.

8. The method of claim 7 wherein the width of said contact holes is equal to that of the bottom of said first and said second openings.

9. The method of claim 1 wherein said substrate is on a wafer and the method is applied on said wafer entirely.

* * * * *